(12) United States Patent
Park (10) Patent No.: US 10,884,066 B2
(45) Date of Patent: Jan. 5, 2021

(54) INSULATION RESISTANCE MEASUREMENT METHOD AND APPARATUS

(71) Applicant: SK Innovation Co., Ltd., Seoul (KR)

(72) Inventor: Jung Hwan Park, Daejeon (KR)

(73) Assignee: SK Innovation Co., Ltd., Seoul (KR)

(*) Notice: Subject to any disclaimer, the term of this patent is extended or adjusted under 35 U.S.C. 154(b) by 411 days.

(21) Appl. No.: 15/895,218

(22) Filed: Feb. 13, 2018

(65) Prior Publication Data

US 2018/0231615 A1    Aug. 16, 2018

(30) Foreign Application Priority Data

Feb. 14, 2017   (KR) .......................... 10-2017-0020007

(51) Int. Cl.
| | | |
|---|---|---|
| G06F 11/30 | (2006.01) | |
| G01R 31/389 | (2019.01) | |
| G01R 31/36 | (2020.01) | |
| G01R 31/392 | (2019.01) | |
| G01R 31/50 | (2020.01) | |

(52) U.S. Cl.
CPC ....... *G01R 31/389* (2019.01); *G01R 31/3646* (2019.01); *G01R 31/3648* (2013.01); *G01R 31/392* (2019.01); *G01R 31/50* (2020.01)

(58) Field of Classification Search
CPC .................................................. G01R 31/389
See application file for complete search history.

(56) References Cited

U.S. PATENT DOCUMENTS

2016/0163127 A1*  6/2016  Kim ..................... H02H 3/14
                                                                    701/36

FOREIGN PATENT DOCUMENTS

| CN | 102707144 B | | 6/2016 |
| KR | 1020100105954 A | | 6/2011 |
| KR | 101619328 | * | 5/2016 |
| KR | 101619328 B1 | | 5/2016 |
| KR | 1020160069800 A | | 6/2016 |

OTHER PUBLICATIONS

Park et al., "Insulation design of battery management system for safety of electric vehicle", Power Electronics Annual Conference, Jul. 2015, 131-132, The Korean Institute of Power Electronics (English-language Abstract attached).

* cited by examiner

*Primary Examiner* — Phuong Huynh
(74) *Attorney, Agent, or Firm* — The Webb Law Firm (57) ABSTRACT

The present invention provides an insulation resistance measurement method capable of accurately measuring an insulation resistance even though insulation breakdown occurs in both ends of a battery by improving an insulation resistance measurement algorithm in spite of utilizing an existing insulation resistance measurement circuit as it is in measuring insulation breakdown of the battery.

15 Claims, 5 Drawing Sheets

INSULATION RESISTANCE MEASUREMENT METHOD AND APPARATUS

CROSS-REFERENCE TO RELATED APPLICATION

This application claims priority to Korean Patent Application No. 10-2017-0020007 filed Feb. 14, 2017, the disclosure of which is hereby incorporated in its entirety by reference.

TECHNICAL FIELD

The following disclosure relates to an insulation resistance measurement method and apparatus, and more particularly, to an insulation resistance measurement method and apparatus capable of accurately measuring an insulation resistance even though insulation breakdown occurs in both ends of a battery by improving an insulation resistance measurement algorithm in spite of utilizing an existing insulation resistance measurement circuit as it is in measuring insulation breakdown of the battery.

BACKGROUND

An electrical circuit provided in most of the electronic products is configured to be insulated from the outside in order to basically prevent occurrence of an accident due to electric leakage or additionally prevent unnecessary noise from being permeated from the outside. However, in a site in which the product is actually used, a case in which a severe environmental condition such as penetration of moisture into the surrounding of the product, or the like, is formed often occurs, and particularly when moisture exists near a power supply, insulation breakdown occurs, such that electric leakage occurs. When an undesired leakage flow of electricity occurs due to the insulation breakdown as described above, a resistance formed in a path through which the electricity is leaked is called an insulation resistance.

For example, a battery provided in a vehicle is disposed in an engine room, and a driving device such as an engine, or the like, and an air conditioning device such as various heat exchangers, or the like, are disposed in the vicinity of the battery, such that there is a possibility that the severe environmental condition as described above will occur. Therefore, the battery is provided with an insulation resistance measurement circuit sensing insulation breakdown in electrodes of the battery, and a battery management system (BMS) is configured to perform an insulation resistance measurement algorithm using the insulation resistance measurement circuit.

Figure 1:
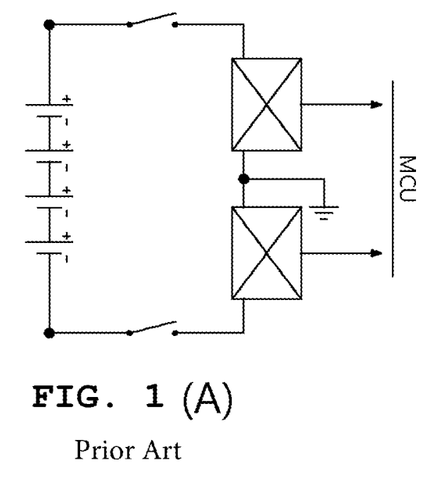
FIGS. 1A to 1D are views illustrating schematic examples of insulation resistance measurement circuits and an insulation resistance measurement principle at the time of insulation breakdown.

FIGS. 1A to 1D illustrate schematic examples of insulation resistance measurement circuits according to the related art. FIG. 1A illustrates a circuit diagram in a state of ordinary times in which insulation breakdown does not occur, that is, a state in which an insulation resistance is not formed. In this case, a battery and a signal measuring unit are not electrically connected to each other, such that any signal is not input to a micro controller unit (MCU). Meanwhile, FIG. 1B illustrates a circuit diagram in the case in which an insulation resistance is formed in a portion adjacent to a negative electrode due to insulation breakdown of the negative electrode, and FIG. 1C illustrates a circuit diagram in the case in which an insulation resistance is formed in a portion adjacent to a positive electrode due to insulation breakdown of the positive electrode. The BMS performs an insulation resistance measurement algorithm using a signal sensed through the insulation resistance measurement circuits as illustrated in FIGS. 1A to 1D. The insulation resistance measurement algorithm will be schematically described. It is periodically confirmed whether or not a signal is generated through the insulation resistance measurement circuits as illustrated in FIGS. 1A to 1D, and when the signal is measured due to electric leakage caused by the insulation breakdown as illustrated in FIGS. 1B and 1C, it is decided that the insulation breakdown occurs.

As described above, in most cases, the insulation breakdown occurs due to permeation of the moisture.

Here, when an insulation breakdown level is low (that is, an amount of leaked current is not very large), the moisture is naturally evaporated, such that the battery may return to a normal state. In this case, it is preferable to display a warning signal, monitor a state, and manage the battery as usual rather than to stop an operation of the battery. On the other hand, when an insulation breakdown level is high (that is, an amount of leaked current is high), an overcurrent flows to an undesired path, such that there is a high risk that an accident such as damage to a circuit, or the like, will occur. Therefore, in this case, it is preferable to immediately stop the operation of the battery. It is necessary to measure a magnitude of the insulation resistance in order to decide the insulation breakdown level as described above. Therefore, the insulation resistance measurement algorithm using the insulation resistance measurement circuits as illustrated in FIGS. 1A to 1D is configured to calculate the magnitude of the insulation resistance when the insulation breakdown is sensed.

In the insulation resistance measurement algorithm according to the related art, the insulation resistance is calculated assuming that the insulation breakdown occurs in one of the negative electrode and the positive electrode as illustrated in FIG. 1B or 1C. However, in the case in which insulation breakdown occurs in both of the negative electrode and the positive electrode as illustrated in FIG. 1D, a large difference exists between an insulation resistance value calculated by the equation as described above and an actual insulation resistance value. That is, in the case in which the insulation breakdown occurs in both of the two electrodes, an accurate and correct insulation resistance value may not be found by the insulation resistance measurement algorithm according to the related art.

Korean Patent No. 1619328 (entitled "Insulation Resistance Measurement Apparatus and Method" and hereinafter referred to as Related Art Document) introduces a circuit having a new configuration in order to measure an insulation resistance and discloses a method of measuring an insulation resistance using the circuit. The Related Art Document pointed out a problem that an insulation breakdown measurement circuit according to the related art may measure insulation breakdown of each of a positive electrode and a negative electrode of a high voltage line connected to a battery, but may not measure insulation breakdown in the case in which the insulation breakdown simultaneously occurs in both of the positive electrode and the negative electrode. The Related Art Document introduces an insulation resistance measurement circuit having a new configuration, and suggests an algorithm configured to sequentially find false resistances (insulation resistances) in the positive electrode and the negative electrode while opening or closing several switches directly or indirectly connected to each of the positive electrode and the negative electrode, in order to solve such a problem.

However, in the case of applying a technology according to the Related Art Document, an insulation resistance measurement circuit included in an existing battery should be changed. Therefore, it is difficult to substantially apply the technology according to the Related Art Document. Furthermore, in the Related Art Document, measurement of the insulation resistances is performed while opening or closing the several switches in several combinations, such that a step is complicated, and an operation load, a calculation load, and the like, may be unnecessarily increased.

Therefore, there is a high necessity to derive a method of accurately measuring an insulation resistance value that is not distorted even when the insulation breakdown occurs in both of the positive electrode and the negative electrode in spite of using the insulation resistance measurement circuit included in the existing battery as it is.

RELATED ART DOCUMENT

Patent Document

1. Korean Patent No. 1619328 (entitled "Insulation Resistance Measurement Apparatus and Method")

SUMMARY

An embodiment of the present invention is directed to providing an insulation resistance measurement method and apparatus capable of accurately measuring an insulation resistance even though insulation breakdown occurs in both ends of a battery by improving an insulation resistance measurement algorithm in spite of utilizing an existing insulation resistance measurement circuit as it is in measuring insulation breakdown of the battery.

In general aspect, an insulation resistance measurement method of measuring an insulation resistance using an insulation resistance measurement circuit including a positive electrode-side node positioned at a positive electrode-side of a battery, a negative electrode-side node positioned at a negative electrode-side of the battery, a ground-side node connected to a ground, a positive electrode-side insulation measuring unit provided between the positive electrode-side node and the ground-side node, and a negative electrode-side insulation measuring unit provided between the negative electrode-side node and the ground-side node in order to sense insulation breakdown of the battery include: a first insulation resistance calculating step in which a first positive electrode-side insulation resistance and a first negative electrode-side insulation resistance are calculated using a positive electrode-side voltage signal and a negative electrode-side voltage signal each measured by the positive electrode-side insulation measuring unit and the negative electrode-side insulation measuring unit and a first positive electrode-side insulation resistance calculation equation and a first negative electrode-side insulation resistance calculation equation when the insulation breakdown occurs in any one of a positive electrode and a negative electrode of the battery; a both-end breakdown deciding step in which a proportional factor value defined as a value obtained by dividing a negative electrode-side insulation resistance by a positive electrode-side insulation resistance is calculated using the first positive electrode-side insulation resistance and the first negative electrode-side insulation resistance and it is decided whether the calculated proportional factor value is 0 or infinity; and a second insulation resistance calculating step in which a second positive electrode-side insulation resistance and a second negative electrode-side insulation resistance are calculated using a second positive electrode-side insulation resistance calculation equation and a second negative electrode-side insulation resistance calculation equation when the insulation breakdown occurs in both of the positive electrode and the negative electrode of the battery, if the proportional factor value is not 0 or infinity.

The insulation resistance measurement method may further include: a first insulation breakdown deciding step in which it is decided (e.g., determined) whether or not at least one of the first positive electrode-side insulation resistance and the first negative electrode-side insulation resistance calculated in the first insulation resistance calculating step is a predetermined reference insulation resistance value or more if the proportional factor value is 0 or infinity in the both-end breakdown deciding step; and a step in which it is decided that the insulation breakdown occurs if at least one of the first positive electrode-side insulation resistance and the first negative electrode-side insulation resistance is less than the predetermined reference insulation resistance value in the first insulation breakdown deciding step.

The insulation resistance measurement method may further include: a second insulation breakdown deciding step in which it is decided whether or not at least one of the second positive electrode-side insulation resistance and the second negative electrode-side insulation resistance calculated in the second insulation resistance calculating step is a predetermined reference insulation resistance value or more, after the second insulation resistance calculating step; and a step in which it is decided that the insulation breakdown occurs if at least one of the second positive electrode-side insulation resistance and the second negative electrode-side insulation resistance is less than the predetermined reference insulation resistance value in the second insulation breakdown deciding step.

The insulation resistance measurement method may further include an insulation breakdown countermeasure step in which a countermeasure against the insulation breakdown is taken if it is decided that the insulation breakdown occurs.

The countermeasure against the insulation breakdown may be an operation of outputting a warning signal for informing a user that the insulation breakdown occurs or an operation of opening the battery.

The positive electrode-side insulation measuring unit of the insulation resistance measurement circuit may include: a positive electrode-side measuring resistor provided between the positive electrode-side node and the ground-side node; a positive electrode-side reference resistor provided between the positive electrode-side node and the positive electrode-side measuring resistor; a positive electrode-side operational amplifier having a pair of input terminals each connected to both ends of the positive electrode-side measuring resistor and an output terminal outputting the positive electrode-side voltage signal; a first positive electrode-side resistor provided between one end of the positive electrode-side measuring resistor and a non-inverting input terminal of the positive electrode-side operational amplifier connected to the one end; a second positive electrode-side resistor provided between the other end of the positive electrode-side measuring resistor and an inverting input terminal of the positive electrode-side operational amplifier connected to the other end; a third positive electrode-side resistor provided between a node between the first positive electrode-side resistor and the non-inverting input terminal of the positive electrode-side operational amplifier and the ground; and a fourth positive electrode-side resistor provided between a node between the second positive electrode-side resistor and the inverting input terminal of the positive electrode-side operational amplifier and the output terminal of the positive electrode-side operational amplifier, resistance values of the first, second, third, and fourth positive electrode-side resistors being the same as each other, and the negative electrode-side insulation measuring unit of the insulation resistance measurement circuit may include: a negative electrode-side measuring resistor provided between the negative electrode-side node and the ground-side node; a negative electrode-side reference resistor provided between the negative electrode-side node and the negative electrode-side measuring resistor; a negative electrode-side operational amplifier having a pair of input terminals each connected to both ends of the negative electrode-side measuring resistor and an output terminal outputting the negative electrode-side voltage signal; a first negative electrode-side resistor provided between one end of the negative electrode-side measuring resistor and a non-inverting input terminal of the negative electrode-side operational amplifier connected to the one end; a second negative electrode-side resistor provided between the other end of the negative electrode-side measuring resistor and an inverting input terminal of the negative electrode-side operational amplifier connected to the other end; a third negative electrode-side resistor provided between a node between the first negative electrode-side resistor and the non-inverting input terminal of the negative electrode-side operational amplifier and the ground; and a fourth negative electrode-side resistor provided between a node between the second negative electrode-side resistor and the inverting input terminal of the negative electrode-side operational amplifier and the output terminal of the negative electrode-side operational amplifier, resistance values of the first, second, third, and fourth negative electrode-side resistors being the same as each other.

The first positive electrode-side insulation resistance calculation equation and the first negative electrode-side insulation resistance calculation equation used in the first insulation resistance calculating step may be represented as follows:

$$Riso\_P = (Vpack \div UC\_AD\_N - 1) \times Rin\_N - Rc \text{ and}$$

$$Riso\_N = (Vpack \div UC\_AD\_P - 1) \times Rin\_P - Rc,$$

where $\|$ indicates a parallel connection, Riso_P indicates a first positive electrode-side insulation resistance value, Riso_N indicates a first negative electrode-side insulation resistance value, Vpack indicates a potential value across the battery, UC_AD_P indicates a positive electrode-side voltage signal value, UC_AD_N indicates a negative electrode-side voltage signal value, Rin_P=Rs$\|$2R, R indicates first, second, third, and fourth positive electrode-side resistance values, Rs indicates a positive electrode-side measuring resistance value, Rc indicates a positive electrode-side reference resistance value, Rin_N=Rs$\|$R, R indicates first, second, third, and fourth negative electrode-side resistance values, Rs indicates a negative electrode-side measuring resistance value, and Rc is a negative electrode-side reference resistance value.

A proportional factor used in the both-end breakdown deciding step may be calculated by the following Equation:

$$K = \frac{Riso\_N}{Riso\_P}.$$

The second positive electrode-side insulation resistance calculation equation and the second negative electrode-side insulation resistance calculation equation used in the second insulation resistance calculating step may be represented as follows:

$$Riso\_P = \frac{\left\{\frac{1}{K} \times (Rc + Rin\_N) \times \left(\frac{Rin\_N}{Rc + Rin\_N}\right) \times Vpack\right\} - \left\{(Rc + Rin\_N) \times \left(\frac{1}{K} + 1\right) \times UC\_AD\_N\right\}}{UC\_AD\_N} \times K \text{ and}$$

$$Riso\_N = \frac{\left\{K \times (Rc + Rin\_P) \times \left(\frac{Rin\_P}{Rc + Rin\_P}\right) \times Vpack\right\} - \{(Rc + Rin\_P) \times (K + 1) \times UC\_AD\_P\}}{UC\_AD\_P \times K},$$

where $\|$ indicates a parallel connection, Riso_P indicates a second positive electrode-side insulation resistance value, Riso_N indicates a second negative electrode-side insulation resistance value, $$K = \frac{UC\_AD\_P}{UC\_AD\_N \times Rin\_P \div Rin\_N}$$

indicates the proportional factor value, Vpack indicates a potential value across the battery, UC_AD_P indicates a positive electrode-side voltage signal value, UC_AD_N indicates a negative electrode-side voltage signal value, Rin_P=Rs$\|$2R, R indicates first, second, third, and fourth positive electrode-side resistance values, Rs indicates a positive electrode-side measuring resistance value, Rc indicates a positive electrode-side reference resistance value, Rin_N=Rs$\|$R, R indicates first, second, third, and fourth negative electrode-side resistance values, Rs indicates a negative electrode-side measuring resistance value, and Rc is a negative electrode-side reference resistance value.

In another general aspect, an insulation resistance measurement apparatus includes: an insulation resistance measurement circuit sensing insulation breakdown of a battery and including a positive electrode-side node positioned at a positive electrode-side of the battery, a negative electrode-side node positioned at a negative electrode-side of the battery, a ground-side node connected to a ground, a positive electrode-side insulation measuring unit provided between the positive electrode-side node and the ground-side node, and a negative electrode-side insulation measuring unit provided between the negative electrode-side node and the ground-side node; and a calculating unit calculating an insulation resistance value using a value measured by the insulation resistance measurement circuit.

The calculating unit may be configured to primarily calculate an insulation resistance value using an insulation resistance calculation equation when the insulation breakdown occurs in any one of a positive electrode and a negative electrode of the battery, calculate a proportional factor value defined as a value obtained by dividing a negative electrode-side insulation resistance by a positive electrode-side insulation resistance using the primarily calculated insulation resistance value, and decide whether the insulation breakdown occurs in only any one of the positive electrode and the negative electrode of the battery or occurs in both of the positive electrode and the negative electrode of the battery using the proportional factor value.

The calculating unit may decide that the insulation breakdown occurs in only any one of the positive electrode and the negative electrode of the battery if the proportional factor value is 0 or infinity, and decide that the insulation breakdown occurs in both of the positive electrode and the negative electrode of the battery when the proportional factor value is not 0 or infinity.

The insulation resistance measurement circuit may be configured to be included in a battery management system (BMS) included in the battery.

The calculating unit may be included in a BMS included in the battery or be formed as a separate device outside the battery.

DETAILED DESCRIPTION OF EMBODIMENTS

Hereinafter, an insulation resistance measurement method and apparatus according to the present invention will be described in detail with reference to the accompanying drawings.

First, an insulation resistance measurement circuit for an insulation resistance measurement method for sensing insulation breakdown of a battery will be schematically described. As in examples schematically illustrated in FIGS. 1A to 1D, the insulation resistance measurement circuit is configured to include a positive electrode-side node P positioned at a positive electrode-side of the battery, a negative electrode-side node N positioned at a negative electrode-side of the battery, a ground-side node G connected to a ground, a positive electrode-side insulation measuring unit provided between the positive electrode-side node P and the ground-side node G, and a negative electrode-side insulation measuring unit provided between the negative electrode-side node N and the ground-side node G. Voltage signals are output from each of the positive electrode-side insulation measuring unit and the negative electrode-side insulation measuring unit, and since a configuration of the insulation resistance measurement circuit itself is known in advance, it is theoretically possible to calculate insulation resistances from the voltage signals using the configuration of the insulation resistance measurement circuit.

Figure 2:
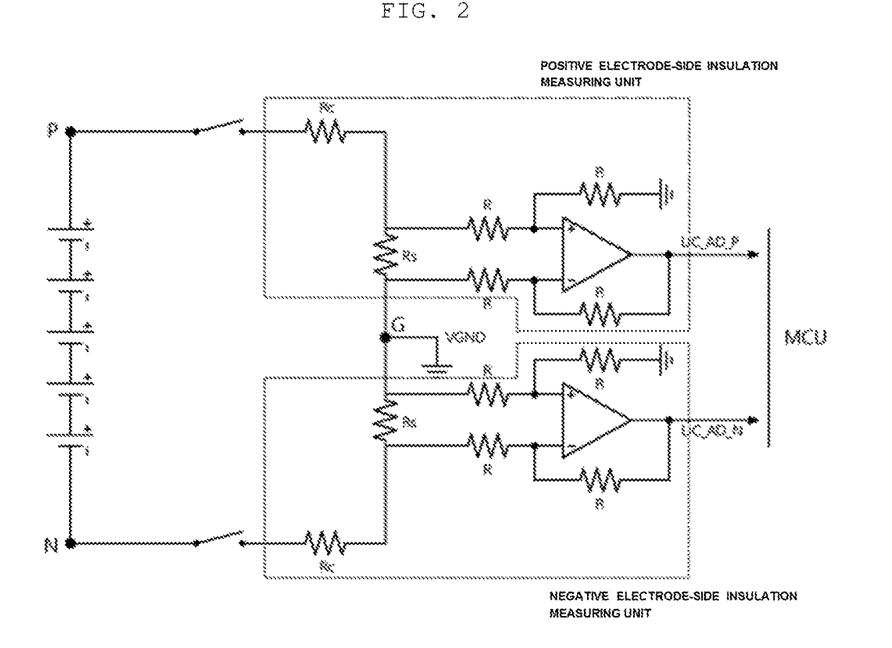
FIG. 2 is a view illustrating a specific example of an insulation resistance measurement circuit.

FIG. 2 is a view illustrating a specific example of an insulation resistance measurement circuit, which corresponds to an insulation resistance measurement circuit included in an existing battery. The positive electrode-side insulation measuring unit and the negative electrode-side insulation measuring unit constituting the insulation resistance measurement circuit are formed substantially symmetrically to each other, as illustrated in FIG. 2.

A configuration of the positive electrode-side insulation measuring unit will be described below. The positive electrode-side insulation measuring unit is configured to include a positive electrode-side measuring resistor, a positive electrode-side reference resistor, a positive electrode-side operational amplifier, and first, second, third, and fourth positive electrode-side resistors. The positive electrode-side measuring resistor (denoted by Rs in FIG. 2) is provided between the positive electrode-side node P and the ground-side node G, and the positive electrode-side reference resistor (denoted by Rc in FIG. 2) is provided between the positive electrode-side node P and the positive electrode-side measuring resistor. The positive electrode-side operational amplifier has a pair of input terminals each connected to both ends of the positive electrode-side measuring resistor, and an output terminal outputting a positive electrode-side voltage signal (denoted by UC_AD_P in FIG. 2).

The first positive electrode-side resistor is provided between one end of the positive electrode-side measuring resistor and a non-inverting input terminal of the positive electrode-side operational amplifier connected to the one end, and the second positive electrode-side resistor is provided between the other end of the positive electrode-side measuring resistor and an inverting input terminal of the positive electrode-side operational amplifier connected to the other end. The third positive electrode-side resistor is provided between a node between the first positive electrode-side resistor and the non-inverting input terminal of the positive electrode-side operational amplifier and the ground, and the fourth positive electrode-side resistor is provided between a node between the second positive electrode-side resistor and the inverting input terminal of the positive electrode-side operational amplifier and the output terminal of the positive electrode-side operational amplifier. Here, resistance values of the first, second, third, and fourth positive electrode-side resistors are the same as each other (they are denoted by R in FIG. 2).

A configuration of the negative electrode-side insulation measuring unit will be described below. The negative electrode-side insulation measuring unit is configured to include a negative electrode-side measuring resistor, a negative electrode-side reference resistor, a negative electrode-side operational amplifier, and first, second, third, and fourth negative electrode-side resistors. The negative electrode-side measuring resistor (denoted by Rs in FIG. 2) is provided between the negative electrode-side node N and the ground-side node G, and the negative electrode-side reference resistor (denoted by Rc in FIG. 2) is provided between the negative electrode-side node N and the negative electrode-side measuring resistor. The negative electrode-side operational amplifier has a pair of input terminals each connected to both ends of the negative electrode-side measuring resistor, and an output terminal outputting a negative electrode-side voltage signal (denoted by UC_AD_N in FIG. 2).

The first negative electrode-side resistor is provided between one end of the negative electrode-side measuring resistor and a non-inverting input terminal of the negative electrode-side operational amplifier connected to the one end, and the second negative electrode-side resistor is provided between the other end of the negative electrode-side measuring resistor and an inverting input terminal of the negative electrode-side operational amplifier connected to the other end. The third negative electrode-side resistor is provided between a node between the first negative electrode-side resistor and the non-inverting input terminal of the negative electrode-side operational amplifier and the ground, and the fourth negative electrode-side resistor is provided between a node between the second negative electrode-side resistor and the inverting input terminal of the negative electrode-side operational amplifier and the output terminal of the negative electrode-side operational amplifier. Here, resistance values of the first, second, third, and fourth negative electrode-side resistors are the same as each other (they are denoted by R in FIG. 2).

As described above, in the related art, in measuring insulation resistances in a battery having the insulation resistance measurement circuit as described above, the insulation resistances are calculated assuming that insulation breakdown occurs in only any one of a positive electrode and a negative electrode of the battery, and distorted insulation resistance values are thus calculated in the case in which the insulation breakdown occurs in both of the positive electrode and the negative electrode. Therefore, in the present invention, it is decided whether the insulation breakdown occurs in only any one of the positive electrode and the negative electrode or occurs in both of the positive electrode and the negative electrode, and if it is decided that the insulation breakdown occurs in both of the positive electrode and the negative electrode, a new calculation equation is introduced to calculate the insulation resistance values, such that the insulation resistance values may be more accurately calculated. Therefore, a countermeasure against a case in which the insulation breakdown occurs may be more rationally taken.

Figure 3:
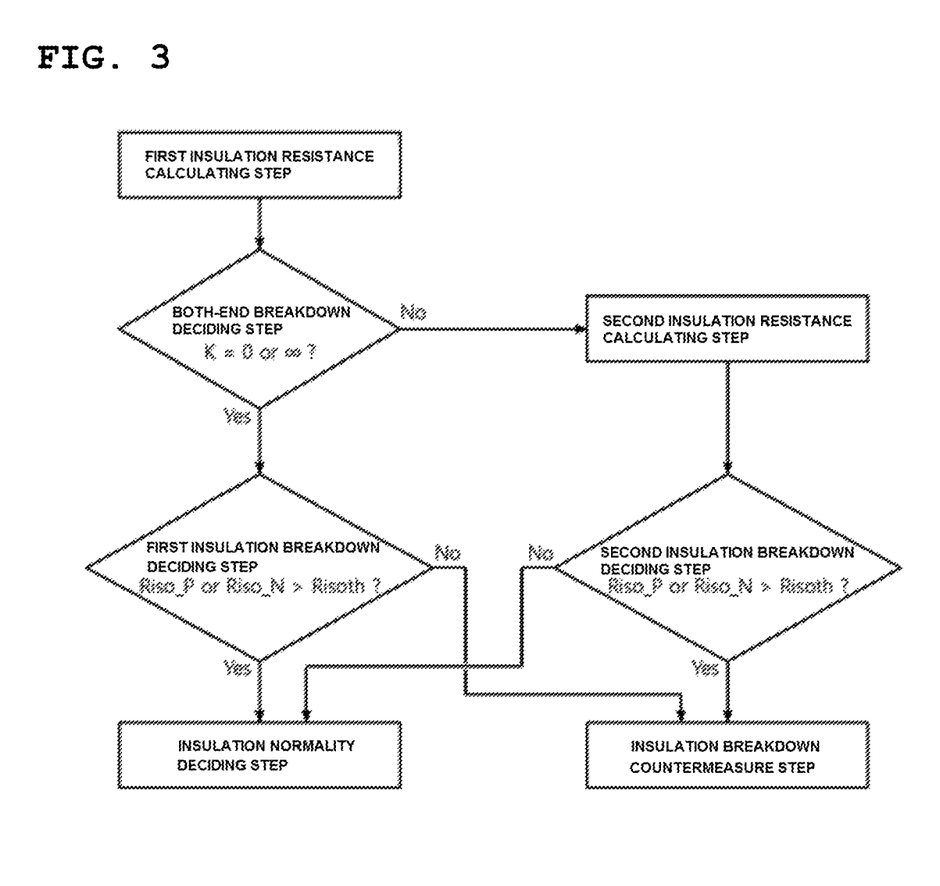
FIG. 3 is a flow chart illustrating an insulation resistance measurement method according to the present invention.

FIG. 3 is a flow chart illustrating an insulation resistance measurement method according to the present invention. The insulation resistance measurement method according to the present invention will be described with reference to FIG. 3. The insulation resistance measurement method according to the present invention may be configured to mainly include a first insulation resistance calculating step, a both-end breakdown deciding step, and a second insulation resistance calculating step.

In the first insulation resistance calculating step, a first positive electrode-side insulation resistance and a first negative electrode-side insulation resistance are calculated using the positive electrode-side voltage signal and the negative electrode-side voltage signal each measured by the positive electrode-side insulation measuring unit and the negative electrode-side insulation measuring unit and a first positive electrode-side insulation resistance calculation equation and a first negative electrode-side insulation resistance calculation equation when the insulation breakdown occurs in any one of the positive electrode and the negative electrode of the battery. As described above, a configuration itself of the insulation resistance measurement circuit included in the battery is known in advance, and it is theoretically possible to calculate the insulation resistances from the output voltage signals. In the related art, the insulation resistances are calculated assuming that the insulation breakdown occurs in only any one of the positive electrode and the negative electrode, and in the case in which the insulation breakdown actually occurs in only any one of the positive electrode and the negative electrode, the insulation resistance values found as described above accurately coincide with actual insulation resistance values. The first insulation resistance calculating step in which the insulation resistances are calculated assuming that the insulation breakdown occurs in only any one of the positive electrode and the negative electrode of the battery as described above may be considered to be the same as an existing insulation resistance measurement method.

Figure 4:
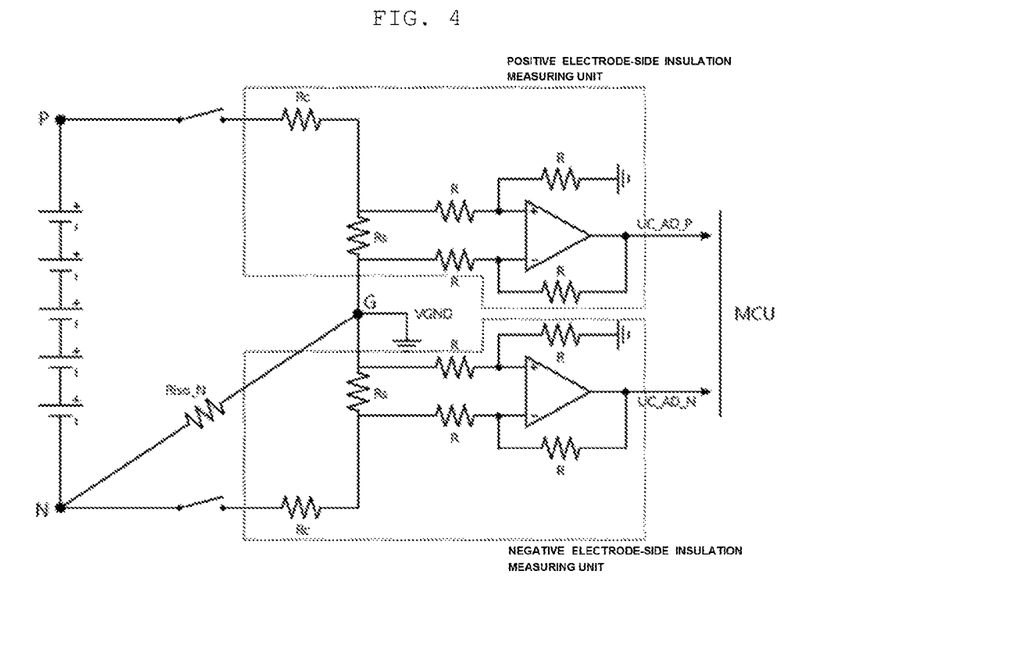
FIG. 4 is a circuit diagram when insulation breakdown occurs in a negative electrode in the insulation resistance measurement circuit.
Figure 5:
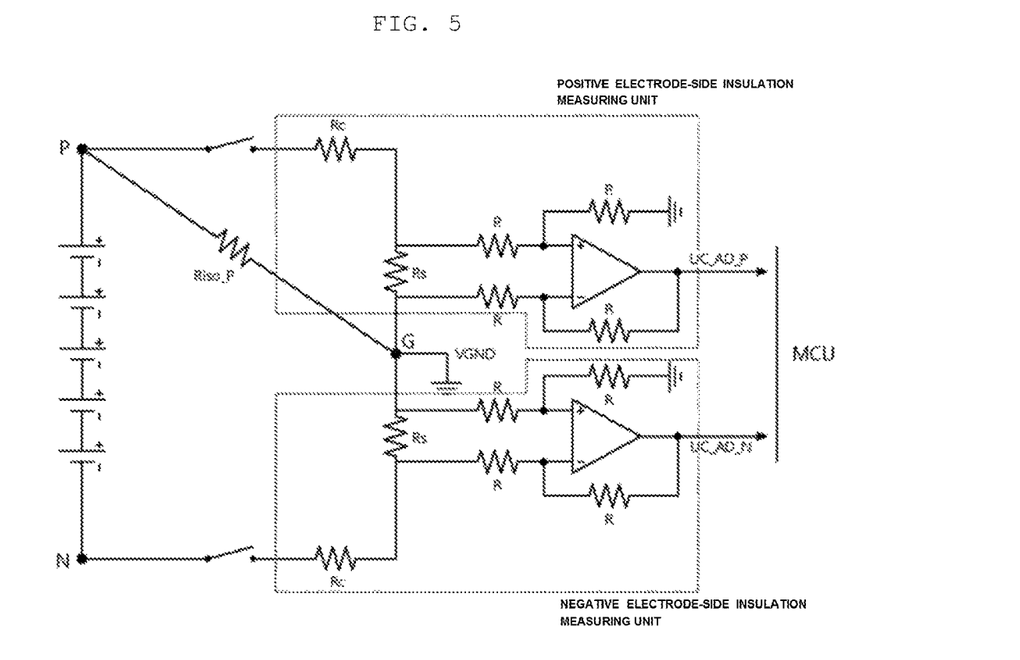
FIG. 5 is a circuit diagram when insulation breakdown occurs in a positive electrode in the insulation resistance measurement circuit.

The first positive electrode-side insulation resistance calculation equation and the first negative electrode-side insulation resistance calculation equation used in the first insulation resistance calculating step may be obtained as follows. In the insulation resistance measurement circuit as illustrated in FIG. 2, a circuit diagram when the insulation breakdown occurs in any one of the positive electrode and the negative electrode of the battery may be represented as illustrated in FIG. 4 or FIG. 5. FIG. 4 is a circuit diagram when insulation breakdown occurs in a negative electrode in the insulation resistance measurement circuit, and FIG. 5 is a circuit diagram when insulation breakdown occurs in a positive electrode in the insulation resistance measurement circuit.

When the insulation breakdown occurs in the negative electrode, a circuit diagram is represented as illustrated in FIG. 4. In this case, the positive electrode-side voltage signal UC_AD_P is output from the positive electrode-side insulation measuring unit. In this case, a relationship between the positive electrode-side voltage signal UC_AD_P and a negative electrode-side insulation resistance Riso_N is represented by the following Equation 1.

$$UC\_AD\_P = \frac{Rin\_P}{Rc + Rin\_P + Riso\_N} \times Vpack \qquad \text{[Equation 1]}$$

$$Rin\_P = Rs \| 2R$$

Here, $\|$ indicates a parallel connection. For example, a "parallel connection between R1 and R2" may be represented by "R1$\|$R2".

When the insulation breakdown occurs in the positive electrode, a circuit diagram is represented as illustrated in FIG. 5. In this case, the negative electrode-side voltage signal UC_AD_N is output from the negative electrode-side insulation measuring unit. In this case, a relationship between the negative electrode-side voltage signal UC_AD_N and a positive electrode-side insulation resistance Riso_P is represented by the following Equation 2.

$$UC\_AD\_N = \frac{Rin\_N}{Rc + Rin\_N + Riso\_P} \times Vpack \qquad \text{[Equation 2]}$$

$$Rin\_N = Rs \| R$$

Here, $\|$ indicates a parallel connection, Riso_P indicates a first positive electrode-side insulation resistance value, Riso_N indicates a first negative electrode-side insulation resistance value, Vpack indicates a potential value across a battery, UC_AD_P indicates a positive electrode-side voltage signal value, UC_AD_N indicates a negative electrode-side voltage signal value, Rin_P=Rs$\|$2R, R indicates first, second, third, and fourth positive electrode-side resistance values, Rs indicates a positive electrode-side measuring resistance value, Rc indicates a positive electrode-side reference resistance value, Rin_N=Rs$\|$R, R indicates first, second, third, and fourth negative electrode-side resistance values, Rs indicates a negative electrode-side measuring resistance value, and Rc indicates a negative electrode-side reference resistance value.

When the above Equations 1 and 2 are arranged on the basis of the insulation resistances, the following Equations 3 and 4, which become the first positive electrode-side insulation resistance calculation equation and the first negative electrode-side insulation resistance calculation equation, respectively, may be obtained.

$$Riso\_P = (Vpack \div UC\_AD\_N - 1) \times Rin\_N - Rc \quad \text{[Equation 3]}$$

$$Riso\_N = (Vpack \div UC\_AD\_P - 1) \times Rin\_P - Rc \quad \text{[Equation 4]}$$

In the both-end breakdown deciding step, a proportional factor value defined as a value obtained by dividing a negative electrode-side insulation resistance by a positive electrode-side insulation resistance is calculated using the first positive electrode-side insulation resistance and the first negative electrode-side insulation resistance, and it is decided whether the calculated proportional factor value is 0 or infinity. That is, the proportional factor may be found by the following Equation 5.

$$K = \frac{Riso\_N}{Riso\_P} \quad \text{[Equation 5]}$$

For example, if the insulation breakdown occurs in the negative electrode, the first negative electrode-side insulation resistance will be found as any finite value. In this case, the first positive electrode-side insulation resistance becomes an infinity value since the insulation breakdown does not occur in the positive electrode. In this case, the proportional factor value is (finite value/infinity) to become 0. To the contrary, if the insulation breakdown occurs in the positive electrode, the first positive electrode-side insulation resistance is found as a finite value, but the first negative electrode-side insulation resistance becomes an infinity value. In this case, the proportional factor value is (infinity/finite value) to become infinity. That is, in the case in which the insulation breakdown occurs in only any one of the positive electrode and the negative electrode, the proportional factor value becomes 0 or infinity.

That is, in the both-end breakdown deciding step, if the proportional factor value is 0 or infinity, it may be decided that the insulation breakdown does not occur in both of the positive electrode and the negative electrode of the battery, but occurs in only any one of the positive electrode and the negative electrode of the battery. In this case, it is decided that the first positive electrode-side insulation resistance or the first negative electrode-side insulation resistance calculated in the first insulation resistance calculating step is an accurate value, and it may be directly decided whether the insulation breakdown occurs using the first positive electrode-side insulation resistance or the first negative electrode-side insulation resistance.

In this step, a process of deciding whether or not the insulation breakdown occurs may be performed through a first insulation breakdown deciding step. In the first insulation breakdown deciding step, if the proportional factor value is 0 or infinity in the both-end breakdown deciding step, it is decided whether or not at least one of the first positive electrode-side insulation resistance and the first negative electrode-side insulation resistance calculated in the first insulation resistance calculating step is a predetermined reference insulation resistance value or more. Here, if at least one of the first positive electrode-side insulation resistance and the first negative electrode-side insulation resistance is less than the predetermined reference insulation resistance value in the first insulation breakdown deciding step, it is decided that the insulation breakdown occurs.

If it is decided that the insulation breakdown occurs, a countermeasure against the insulation breakdown may be taken, which will be described in detail below.

As described above, in the both-end breakdown deciding step, if the proportional factor value is 0 or infinity, it may be decided that the insulation breakdown does not occur in both of the positive electrode and the negative electrode of the battery, but occurs in only any one of the positive electrode and the negative electrode of the battery. On the other hand, if the proportional factor value is not 0 or infinity, it may be decided that a situation is not a situation in which the insulation breakdown occurs in only one of the positive electrode and the negative electrode. That is, in this case, it may be decided that a situation is a situation in which the insulation breakdown occurs in both of the positive electrode and the negative electrode. In the present invention, a new insulation resistance calculation equation in the situation in which the insulation breakdown occurs in both of the positive electrode and the negative electrode as described above is introduced, which will be described in detail below.

Figure 6:
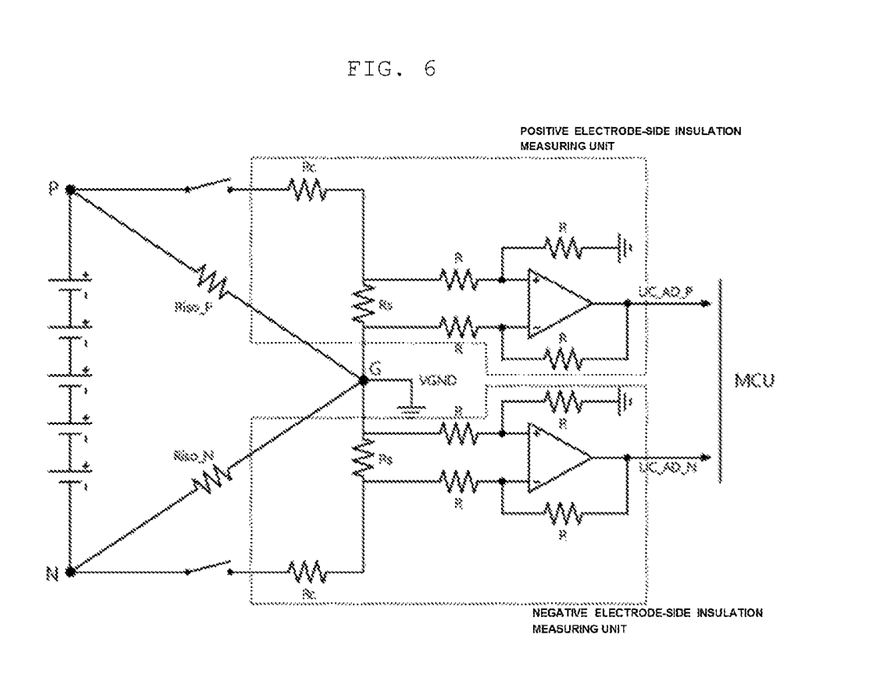
FIG. 6 is a circuit diagram when insulation breakdown occurs in both of a negative electrode and a positive electrode in the insulation resistance measurement circuit.

FIG. 6 is a circuit diagram when insulation breakdown occurs in both of a negative electrode and a positive electrode in the insulation resistance measurement circuit. In this case, a relationship between the positive electrode-side voltage signal UC_AD_P output from the positive electrode-side insulation measuring unit and the negative electrode-side insulation resistance Riso_N is represented by the following Equation 6, and a relationship between the negative electrode-side voltage signal UC_AD_N output from the negative electrode-side insulation measuring unit and the positive electrode-side insulation resistance Riso_P is represented by the following Equation 7.

$$UC\_AD\_P = \frac{\{Rc + Rin\_P\} \| Riso\_P}{\{Rc + Rin\_P\} \| Riso\_P + Riso\_N} \times \frac{Rin\_P}{Rc + Rin\_P} \times Vpack \quad \text{[Equation 6]}$$

$$UC\_AD\_N = \frac{\{Rc + Rin\_N\} \| Riso\_N}{\{Rc + Rin\_N\} \| Riso\_N + Riso\_P} \times \frac{Rin\_N}{Rc + Rin\_N} \times Vpack \quad \text{[Equation 7]}$$

Here, Riso_P indicates a second positive electrode-side insulation resistance value, and Riso_N indicates a second negative electrode-side insulation resistance value.

Hereinabove, the proportional factor value was defined as the value obtained by dividing the negative electrode-side insulation resistance by the positive electrode-side insulation resistance. That is, when the proportional factor value is calculated using the second positive electrode-side insulation resistance and the second negative electrode-side insulation resistance, if the above Equations 5, 6, and 7 are combined with one another, a relational expression as represented by the following Equation 8 may be obtained.

$$K = \frac{Riso\_N}{Riso\_P} \cong \frac{UC\_AD\_P}{UC\_AD\_N \times Rin\_P \div Rin\_N} \quad \text{[Equation 8]}$$

That is, in the case in which the insulation breakdown occurs in both ends of the battery, the positive electrode-side voltage signal UC_AD_P and the negative electrode-side voltage signal UC_AD_N may be substituted into the above Equation 8 to find the proportional factor value appearing as a finite specific value.

In addition, when the above Equations 5 and 6 and the above Equation 8 are combined with each other and are arranged on the basis of the insulation resistances, the following Equations 9 and 10, which become a second positive electrode-side insulation resistance calculation equation and a second negative electrode-side insulation resistance calculation equation, respectively, may be obtained.

$$Riso\_P = \frac{\left\{\frac{1}{K} \times (Rc + Rin\_N) \times \left(\frac{Rin\_N}{Rc + Rin\_N}\right) \times Vpack\right\} - \left\{(Rc + Rin\_N) \times \left(\frac{1}{K} + 1\right) \times UC\_AD\_N\right\}}{UC\_AD\_N} \times K \quad \text{[Equation 9]}$$

$$Riso\_N = \frac{\left\{K \times (Rc + Rin\_P) \times \left(\frac{Rin\_P}{Rc + Rin\_P}\right) \times Vpack\right\} - \{(Rc + Rin\_P) \times (K + 1) \times UC\_AD\_P\}}{UC\_AD\_P \times K} \quad \text{[Equation 10]}$$

That is, if the proportional factor value is not 0 or infinity in the both-end breakdown deciding step, it is decided that the insulation breakdown occurs in both ends of the battery, and the second insulation resistance calculating step is performed. In the second insulation resistance calculating step, the second positive electrode-side insulation resistance and the second negative electrode-side insulation resistance are calculated using the second positive electrode-side insulation resistance calculation equation and the second negative electrode-side insulation resistance calculation equation (that is, the above Equations 9 and 10) when the insulation breakdown occurs in both of the positive electrode and the negative electrode of the battery.

In this step, a process of deciding whether or not the insulation breakdown occurs may be performed through a second insulation breakdown deciding step. In the second insulation breakdown deciding step, after the second insulation resistance calculating step, it is decided whether or not at least one of the second positive electrode-side insulation resistance and the second negative electrode-side insulation resistance calculated in the second insulation resistance calculating step is a predetermined reference insulation resistance value or more. Here, if at least one of the second positive electrode-side insulation resistance and the second negative electrode-side insulation resistance is less than the predetermined reference insulation resistance value in the second insulation breakdown deciding step, it is decided that the insulation breakdown occurs.

If it is decided that the insulation breakdown occurs, a countermeasure against the insulation breakdown may be taken. In this case, the same operation as that when it is decided that the insulation breakdown occurs in the first insulation breakdown deciding step may be performed. That is, if it is decided that the insulation breakdown occurs in any of the first insulation breakdown deciding step and the second insulation breakdown deciding step, an insulation breakdown countermeasure step in which the countermeasure against the insulation breakdown is taken is performed.

The countermeasure against the insulation breakdown taken in the insulation breakdown countermeasure step may be an operation of outputting a warning signal for informing a user that the insulation breakdown occurs or an operation of opening the battery. As described above, even though the insulation breakdown occurs, in the case in which an insulation breakdown level is low (for example, in the case in which moisture small enough to be removed by natural evaporation is permeated into the battery), operations of the battery and an apparatus connected to the battery do not need to be stopped, and it is sufficient only to output a warning signal for indicating that the insulation breakdown occurs. However, in the case in which an insulation breakdown level is high (for example, in the case in which a significant amount of water is permeated into the battery), it is preferable to stop the operations of the battery and the apparatus connected to the battery by opening a connection between the battery and the apparatus connected to the battery in order to avoid a risk that larger damage such as a short-circuit, or the like, will occur. Here, the insulation breakdown level may be measured by the insulation resistance values found through the steps described above. It may be decided that the insulation breakdown level becomes small as the insulation resistance values become large and the insulation breakdown level becomes large as the insulation resistance values become small, and the insulation resistance values are not limited to specific values, but may be appropriately determined as needed.

As described above, according to the insulation resistance measurement method according to the present invention, the insulation resistances when the insulation breakdown occurs in both of the positive electrode and the negative electrode of the battery as well as the insulation resistances when the insulation breakdown occurs in one of the positive electrode and the negative electrode of the battery may be accurately measured. An insulation resistance measurement apparatus that uses the insulation resistance measurement method described above may be configured to include the insulation resistance measurement circuit and a calculating unit calculating insulation resistance values using values measured by the insulation resistance measurement circuit.

In this case, the insulation resistance measurement circuit may be configured to be included in a battery management system (BMS) included in the battery. Generally, in a battery manufacturing process, the BMS is separately manufactured in a circuit form on a board in advance, and is then electrically connected to battery cells through processes such as a process of stacking the battery cells, assembling several components, and the like. That is, since the BMS itself is also configured in the circuit form, the insulation resistance measurement circuit is configured to be included in the BMS, such that a separate circuit unit does not need to be further manufactured or assembled. As a result, a process of manufacturing the battery may be more convenient.

In addition, the calculating unit is a device performing sensing, calculation, or the like, of several data using the insulation resistance measurement method as described above. For example, the calculating unit may be configured in a chip form in which the algorithm as described above is embedded. In this case, the calculating unit may be configured to be included in the BMS included in the battery. Alternatively, the calculating unit may be formed as a separate device outside the battery. For example, in the case in which the battery is provided in a vehicle, the calculating unit may be configured so that the algorithm as described above is embedded in a software form in a microcomputer of the vehicle.

According to the present invention, the insulation resistance measurement algorithm may be improved to more accurately measure the insulation resistances. In more detail, the existing insulation resistance measurement algorithm may accurately calculate the insulation resistances when the insulation breakdown occurs in any one of the positive electrode and the negative electrode of the battery, but may not accurately calculate the insulation resistances when the insulation breakdown occurs in both of the positive electrode and the negative electrode of the battery. However, the present invention includes a step of confirming whether the insulation breakdown occurs in only any one of the positive electrode and the negative electrode of the battery or occurs in both of the positive electrode and the negative electrode of the battery and a step of newly calculating the insulation resistances through new equations if it is confirmed that the insulation breakdown occurs in both of the positive electrode and the negative electrode of the battery, thereby making it possible to accurately measure the insulation resistances when that the insulation breakdown occurs in both of the positive electrode and the negative electrode of the battery.

Furthermore, in the present invention, since the existing insulation resistance measurement circuit is utilized as it is, and a new device or component does not need to be further included, such that compatibility with an existing product is maximized. That is, a product equipment of products that are currently being produced does not need to be changed at all, and a technology of the present invention may be applied in a software upgrade form even to products that were produced and sold in advance, such that an economical potential effect in applying the technology of the present invention is maximized.

The present invention is not limited to the abovementioned exemplary embodiments, but may be variously applied. In addition, the present invention may be variously modified by those skilled in the art to which the present invention pertains without departing from the gist of the present invention claimed in the claims.

What is claimed is:

1. An insulation resistance measurement method of measuring an insulation resistance using an insulation resistance measurement circuit including a positive electrode-side node positioned at a positive electrode-side of a battery, a negative electrode-side node positioned at a negative electrode-side of the battery, a ground-side node connected to a ground, a positive electrode-side insulation measuring unit provided between the positive electrode-side node and the ground-side node, and a negative electrode-side insulation measuring unit provided between the negative electrode-side node and the ground-side node in order to sense insulation breakdown of the battery, comprising:

a first insulation resistance calculating step in which a first positive electrode-side insulation resistance and a first negative electrode-side insulation resistance are calculated using a positive electrode-side voltage signal and a negative electrode-side voltage signal each measured by the positive electrode-side insulation measuring unit and the negative electrode-side insulation measuring unit and a first positive electrode-side insulation resistance calculation equation and a first negative electrode-side insulation resistance calculation equation when the insulation breakdown occurs in any one of a positive electrode and a negative electrode of the battery;

a both-end breakdown deciding step in which a proportional factor value defined as a value obtained by dividing a negative electrode-side insulation resistance by a positive electrode-side insulation resistance is calculated using the first positive electrode-side insulation resistance and the first negative electrode-side insulation resistance and it is decided whether the calculated proportional factor value is 0 or infinity; and a second insulation resistance calculating step in which a second positive electrode-side insulation resistance and a second negative electrode-side insulation resistance are calculated using a second positive electrode-side insulation resistance calculation equation and a second negative electrode-side insulation resistance calculation equation when the insulation breakdown occurs in both of the positive electrode and the negative electrode of the battery, if the proportional factor value is not 0 or infinity.

2. The insulation resistance measurement method of claim 1, further comprising:

a first insulation breakdown deciding step in which it is decided whether or not at least one of the first positive electrode-side insulation resistance and the first negative electrode-side insulation resistance calculated in the first insulation resistance calculating step is a predetermined reference insulation resistance value or more if the proportional factor value is 0 or infinity in the both-end breakdown deciding step; and a step in which it is decided that the insulation breakdown occurs if at least one of the first positive electrode-side insulation resistance and the first negative electrode-side insulation resistance is less than the predetermined reference insulation resistance value in the first insulation breakdown deciding step.

3. The insulation resistance measurement method of claim 1, further comprising:

a second insulation breakdown deciding step in which it is decided whether or not at least one of the second positive electrode-side insulation resistance and the second negative electrode-side insulation resistance calculated in the second insulation resistance calculating step is a predetermined reference insulation resistance value or more, after the second insulation resistance calculating step; and a step in which it is decided that the insulation breakdown occurs if at least one of the second positive electrode-side insulation resistance and the second negative electrode-side insulation resistance is less than the predetermined reference insulation resistance value in the second insulation breakdown deciding step.

4. The insulation resistance measurement method of claim 2, further comprising an insulation breakdown countermeasure step in which a countermeasure against the insulation breakdown is taken if it is decided that the insulation breakdown occurs.

5. The insulation resistance measurement method of claim 3, further comprising an insulation breakdown countermeasure step in which a countermeasure against the insulation breakdown is taken if it is decided that the insulation breakdown occurs.

6. The insulation resistance measurement method of claim 4, wherein the countermeasure against the insulation breakdown is an operation of outputting a warning signal for informing a user that the insulation breakdown occurs or an operation of opening the battery.

7. The insulation resistance measurement method of claim 5, wherein the countermeasure against the insulation breakdown is an operation of outputting a warning signal for informing a user that the insulation breakdown occurs or an operation of opening the battery.

8. The insulation resistance measurement method of claim 1, wherein the positive electrode-side insulation measuring unit of the insulation resistance measurement circuit includes:

a positive electrode-side measuring resistor provided between the positive electrode-side node and the ground-side node;

a positive electrode-side reference resistor provided between the positive electrode-side node and the positive electrode-side measuring resistor;

a positive electrode-side operational amplifier having a pair of input terminals each connected to both ends of the positive electrode-side measuring resistor and an output terminal outputting the positive electrode-side voltage signal;

a first positive electrode-side resistor provided between one end of the positive electrode-side measuring resistor and a non-inverting input terminal of the positive electrode-side operational amplifier connected to the one end;

a second positive electrode-side resistor provided between the other end of the positive electrode-side measuring resistor and an inverting input terminal of the positive electrode-side operational amplifier connected to the other end;

a third positive electrode-side resistor provided between a node between the first positive electrode-side resistor and the non-inverting input terminal of the positive electrode-side operational amplifier and the ground; and a fourth positive electrode-side resistor provided between a node between the second positive electrode-side resistor and the inverting input terminal of the positive electrode-side operational amplifier and the output terminal of the positive electrode-side operational amplifier, resistance values of the first, second, third, and fourth positive electrode-side resistors being the same as each other, and the negative electrode-side insulation measuring unit of the insulation resistance measurement circuit includes:

a negative electrode-side measuring resistor provided between the negative electrode-side node and the ground-side node;

a negative electrode-side reference resistor provided between the negative electrode-side node and the negative electrode-side measuring resistor;

a negative electrode-side operational amplifier having a pair of input terminals each connected to both ends of the negative electrode-side measuring resistor and an output terminal outputting the negative electrode-side voltage signal;

a first negative electrode-side resistor provided between one end of the negative electrode-side measuring resistor and a non-inverting input terminal of the negative electrode-side operational amplifier connected to the one end;

a second negative electrode-side resistor provided between the other end of the negative electrode-side measuring resistor and an inverting input terminal of the negative electrode-side operational amplifier connected to the other end;

a third negative electrode-side resistor provided between a node between the first negative electrode-side resistor and the non-inverting input terminal of the negative electrode-side operational amplifier and the ground; and a fourth negative electrode-side resistor provided between a node between the second negative electrode-side resistor and the inverting input terminal of the negative electrode-side operational amplifier and the output terminal of the negative electrode-side operational amplifier, resistance values of the first, second, third, and fourth negative electrode-side resistors being the same as each other.

9. The insulation resistance measurement method of claim 8, wherein the first positive electrode-side insulation resistance calculation equation and the first negative electrode-side insulation resistance calculation equation used in the first insulation resistance calculating step are represented as follows:

$$\text{Riso\_P} = (V\text{pack} \div UC\_AD\_N - 1) \times Rin\_N - Rc \text{ and}$$

$$\text{Riso\_N} = (V\text{pack} \div UC\_AD\_P - 1) \times Rin\_P - Rc,$$

where $\|$ indicates a parallel connection, Riso_P indicates a first positive electrode-side insulation resistance value, Riso_N indicates a first negative electrode-side insulation resistance value, Vpack indicates a potential value across the battery, UC_AD_P indicates a positive electrode-side voltage signal value, UC_AD_N indicates a negative electrode-side voltage signal value, $Rin\_P = Rs\|2R$, R indicates first, second, third, and fourth positive electrode-side resistance values, Rs indicates a positive electrode-side measuring resistance value, Rc indicates a positive electrode-side reference resistance value, $Rin\_N = Rs\|R$, R indicates first, second, third, and fourth negative electrode-side resistance values, Rs indicates a negative electrode-side measuring resistance value, and Rc is a negative electrode-side reference resistance value.

10. The insulation resistance measurement method of claim 9, wherein a proportional factor used in the both-end breakdown deciding step is calculated by the following Equation:

$$K = \frac{\text{Riso\_N}}{\text{Riso\_P}}.$$

11. The insulation resistance measurement method of claim 8, wherein the second positive electrode-side insulation resistance calculation equation and the second negative electrode-side insulation resistance calculation equation used in the second insulation resistance calculating step are represented as follows:

$$\text{Riso\_P} = \frac{\left\{\frac{1}{K} \times (Rc + Rin\_N) \times \left(\frac{Rin\_N}{Rc + Rin\_N}\right) \times Vpack\right\} - \left\{(Rc + Rin\_N) \times \left(\frac{1}{K} + 1\right) \times UC\_AD\_N\right\}}{UC\_AD\_N} \times K \text{ and}$$

$$\text{Riso\_N} = \frac{\left\{K \times (Rc + Rin\_P) \times \left(\frac{Rin\_P}{Rc + Rin\_P}\right) \times Vpack\right\} - \{(Rc + Rin\_P) \times (K + 1) \times UC\_AD\_P\}}{UC\_AD\_P \times K},$$

where $\|$ indicates a parallel connection, Riso_P indicates a second positive electrode-side insulation resistance value, Riso_N indicates a second negative electrode-side insulation resistance value, $$K = \frac{UC\_AD\_P}{UC\_AD\_N \times Rin\_P \div Rin\_N}$$

indicates the proportional factor value, Vpack indicates a potential value across the battery, UC_AD_P indicates a positive electrode-side voltage signal value, UC_AD_N indicates a negative electrode-side voltage signal value, Rin_P=Rs∥2R, R indicates first, second, third, and fourth positive electrode-side resistance values, Rs indicates a positive electrode-side measuring resistance value, Rc indicates a positive electrode-side reference resistance value, Rin_N=Rs∥R, R indicates first, second, third, and fourth negative electrode-side resistance values, Rs indicates a negative electrode-side measuring resistance value, and Rc is a negative electrode-side reference resistance value.

12. An insulation resistance measurement apparatus comprising:

an insulation resistance measurement circuit sensing insulation breakdown of a battery and including a positive electrode-side node positioned at a positive electrode-side of the battery, a negative electrode-side node positioned at a negative electrode-side of the battery, a ground-side node connected to a ground, a positive electrode-side insulation measuring unit provided between the positive electrode-side node and the ground-side node, and a negative electrode-side insulation measuring unit provided between the negative electrode-side node and the ground-side node; and a calculating unit calculating an insulation resistance value using a value measured by the insulation resistance measurement circuit, wherein the calculating unit is configured to primarily calculate an insulation resistance value using an insulation resistance calculation equation when the insulation breakdown occurs in any one of a positive electrode and a negative electrode of the battery, calculate a proportional factor value defined as a value obtained by dividing a negative electrode-side insulation resistance by a positive electrode-side insulation resistance using the primarily calculated insulation resistance value, and decide whether the insulation breakdown occurs in only any one of the positive electrode and the negative electrode of the battery or occurs in both of the positive electrode and the negative electrode of the battery using the proportional factor value.

13. The insulation resistance measurement apparatus of claim 12, wherein the calculating unit decides that the insulation breakdown occurs in only any one of the positive electrode and the negative electrode of the battery if the proportional factor value is 0 or infinity, and decides that the insulation breakdown occurs in both of the positive electrode and the negative electrode of the battery when the proportional factor value is not 0 or infinity.

14. The insulation resistance measurement apparatus of claim 12, wherein the insulation resistance measurement circuit is configured to be included in a battery management system (BMS) included in the battery.

15. The insulation resistance measurement apparatus of claim 12, wherein the calculating unit is included in a BMS included in the battery or is formed as a separate device outside the battery.

* * * * *